United States Patent
Kagaya et al.

(10) Patent No.: US 6,674,323 B2
(45) Date of Patent: Jan. 6, 2004

(54) HIGH FREQUENCY POWER AMPLIFIER, HIGH FREQUENCY POWER AMPLIFIER MODULE, AND PORTABLE TELEPHONE

(75) Inventors: Osamu Kagaya, Tokyo (JP); Masami Ohnishi, Hachioji (JP); Kenji Sekine, Hinode (JP); Tomonori Tanoue, Machida (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/192,589

(22) Filed: Jul. 11, 2002

(65) Prior Publication Data

US 2003/0048132 A1 Mar. 13, 2003

(30) Foreign Application Priority Data

Sep. 11, 2001 (JP) ................................................ 274499

(51) Int. Cl.[7] ................................................ H03F 1/14
(52) U.S. Cl. ...................... 330/51; 330/124 R; 330/295
(58) Field of Search ............................... 330/51, 124 R, 330/129, 295, 302

(56) References Cited

U.S. PATENT DOCUMENTS

| | | | |
|---|---|---|---|
| 5,548,246 A | | 8/1996 | Yamamoto et al. ............ 330/51 |
| 5,694,085 A | * | 12/1997 | Walker ........................ 330/295 |
| 5,786,727 A | * | 7/1998 | Sigmon .................... 330/124 R |
| 6,297,694 B1 | * | 10/2001 | Yamamoto ..................... 330/51 |
| 2003/0025555 A1 | | 2/2003 | Ohnishi et al. ........ 330/124 IR |

FOREIGN PATENT DOCUMENTS

JP 7-336168 6/1994

* cited by examiner

Primary Examiner—Tuan T. Lam
Assistant Examiner—Hiep Nguyen
(74) Attorney, Agent, or Firm—Reed Smith, LLP; Stanley P. Fisher, Esq.; Juan Carlos A. Marquez, Esq.

(57) ABSTRACT

To provide a small-sized high frequency power amplifier for preventing oscillation by a small number of switching circuits and outputting high power and low power with high efficiencies, a high frequency power amplifier module and a portable telephone, the high frequency power amplifier is constituted by an amplifying circuit A and an amplifying circuit B connected in parallel, a size of a transistor at an output stage of the amplifying circuit B is made to be equal to or smaller than ¼ of a size of a transistor of an output stage of the amplifying circuit A and a switching circuit is connected between a signal line forward from the output stage of the amplifying circuit A and a ground terminal.

20 Claims, 8 Drawing Sheets

SW10: DIODE SWITCH CIRCUIT
Vsw10: DIODE SWITCH CONTROL TERMINAL

SW10 : DIODE SWITCH CIRCUIT
Vsw10 : DIODE SWITCH CONTROL TERMINAL

|   |                 | CONTROL VOLTAGE |      | OPERATION |       |      |
|---|-----------------|------|------|-------|-------|------|
|   |                 | Vmode | Vreg | Q1, Q2 | Q3, Q4 | SW10 |
| 1 | HIGH POWER TIME | low  | high | ON    | OFF   | OFF  |
| 2 | LOW POWER TIME  | high | high | OFF   | ON    | ON   |
| 3 | STANDBY TIME    | low  | low  | OFF   | OFF   | OFF  |
| 4 | PROHIBITION     | high | low  | OFF   | OFF   | ON   |

HIGH FREQUENCY POWER AMPLIFIER, HIGH FREQUENCY POWER AMPLIFIER MODULE, AND PORTABLE TELEPHONE

FIELD OF THE INVENTION

The present invention relates to a power amplifier for amplifying a high frequency signal of from UHF (Ultra High Frequency) to microwave band, particularly to a high frequency power amplifier preferable by being applied to a transmitting portion of a portable telephone.

BACKGROUND OF THE INVENTION

According to a portable telephone of mobile communication, there has been remarkable progress in a function and a structure thereof and a reduction in cost and demand therefor has been promoted rapidly. Further, according to a transistor high frequency power amplifier used in a transmitting portion of a portable telephone, under such a situation, small-sized formation, high efficiency formation, and low cost formation have been pursued. Above all, an efficiency (power added efficiency) constituting a ratio of output power to consumption power, constitutes an important characteristic for prolonging a continuous transmission time period of a portable telephone, that is, battery life in speech time since the high frequency power amplifier is a device having the largest consumption power in the portable telephone.

Now, with regard to the high frequency power amplifier, in view of a state of actually using a portable telephone, the high frequency power amplifier is requested to be highly efficient in two different output power levels, described below. One of them is a high output level at a vicinity of a maximum output, specifically, substantially 1 W. This is a level necessary when a portable telephone is remote from a base station or when radio wave is difficult to reach a base station as in a building or the like. Other thereof is a low output level of 10 mW through 100 mW having a large frequency of use in a normal actual used state. There is disclosed a conventional high frequency power amplifier realizing high efficiencies at the two different output levels in, for example, JP-A-336168/1995.

As shown by FIG. 14, the conventional high frequency power amplifier is an amplifier of a two stages constitution using a field effect transistor (hereinafter, referred to as "FET") for a transistor and a post stage thereof is constituted by an output stage 100a of high output using a transistor HA2 and an output stage 100b of low output using a transistor LA3 and either one of them is used by switching. Further, notation IA1 designates an initial stage amplifying transistor and notations IM1, M12, INM3, OM3, and OM2 designate matching circuits. Notations SW1 through SW3 designate switching circuits each constituted by FET, which are inserted in series with high frequency signal paths for carrying out operation of switching high output and low output.

A transistor amplifier is provided with a property in which an efficiency thereof becomes the highest when maximum output determined by a size of the transistor is outputted and therefore, by using transistors having sizes respectively corresponding to high output and low output, high efficiencies can be achieved respectively for high output and low output.

The high frequency power amplifier in FIG. 14 is based on the principle and by making the transistor HA2 larger than the transistor LA3, high power added efficiencies are achieved at respective levels of high output and low output. That is, according to the high frequency power amplifier, at high output time, the transistors IA1 and HA2 are brought into an operational state, the transistor LA3 is brought into a nonoperational state, the switching circuit SW1 is made ON, the switching circuits SW2 and SW3 are made OFF, thereby, the transistor HA2 of a final stage having a larger size outputs high power at high efficiency. Further, at low output time, the transistors IA1 and LA3 are brought into an operational state, the transistor HA2 is brought into a nonoperational state, the switching circuit SW1 is made OFF, the switching circuits SW2 and SW3 are made ON, thereby, the transistor LA3 at a final stage having a smaller size outputs low power at high efficiency.

Further, although the switching circuits SW1 and SW2 do not contribute to high efficiency operation, the switching circuits SW1 and SW2 are used with an object of avoiding parasitic oscillation from being brought about by forming a feedback loop. That is, the switching circuit SW2 is used for cutting a circuit of the output stage 100b in which the transistor LA3 is brought into the nonoperational state from being electrically connected between an output side and an input side of the output stage 100a when the transistor HA2 is brought into the operational state, meanwhile, the switching circuit SW1 is used for cutting a circuit of the output stage 100a in which the transistor HA2 is brought into the nonoperational state from being electrically connected between an output side and an input side of the output stage 100b when the transistor LA3 is brought into the operational state.

According to the above-described conventional technology, when high efficiency formation of the high frequency power amplifier is intended to promote further, power loss caused in the switching circuits SW1 through SW3 inserted in series with the signal lines, cannot be disregarded. In order to reduce the loss in the switching circuit, ON-state series resistance of the switching circuit is obliged to reduce, that is, the size of FET constituting the switching circuit is obliged to enlarge. When three pieces of switching circuits and respective transistors for amplification are mounted to a single piece of a semiconductor chip (semiconductor pellet), which is normally carried out, large-sized formation of such a switching circuit constitutes a hazard in promoting low cost formation by downsizing a semiconductor chips size.

It is an object of the invention to provide a small-sized high frequency power amplifier for preventing oscillation by a small number of switching circuits and outputting high power and low power at high frequencies, a high frequency power amplifier module, and a portable telephone.

SUMMARY OF THE INVENTION

A high frequency power amplifier according to the invention for achieving the above-described object is characterized in comprising an amplifying circuit A (first amplifying circuit) and an amplifying circuit B (second amplifying circuit) connected in parallel, in which a size of a transistor at an output stage of the amplifying circuit B is equal to or smaller than ¼ of that of a transistor at an output stage of the amplifying circuit A and a switching circuit is connected between a signal line forward from the output stage of the amplifying circuit A and the ground terminal. Further, the amplifying circuit A outputs a high frequency signal of high power when the transistor constituting the amplifying circuit B is brought into a nonoperational state and the switching circuit is made OFF and the amplifying circuit B outputs a high frequency signal of low power when the transistor constituting the amplifying circuit A is brought into the nonoperational state and the switching circuit is made ON.

By the above-described constitution, a switching circuit for switching inserted in series with the signal line is dispensed with and the high power and the low power can be outputted with an efficiency higher than that of the conventional example. Such an effect can be achieved by installing the above-described switching circuit and setting the sizes of the transistors at the output stages.

That is, at low output time, by making ON and grounding the switching circuit connected to the signal line on the high output side, a feedback loop is not formed and the parasitic oscillation is avoided. Meanwhile, according to the transistor of the output stage of the amplifying circuit B, when the transistor is brought into the nonoperational state, the parasitic capacitance is small since the size is small. Therefore, at high output time, by high impedance caused by the small parasitic capacitance of the transistor in the nonoperational state, there is not formed a feedback loop to a degree of causing parasitic oscillation and the parasitic oscillation is avoided. In order to avoid the parasitic oscillation, it is preferable that the size of the transistor at the-output stage of the amplifying circuit B is made to be equal to or smaller than ¼ of that of the amplifying circuit A.

Further, the switching circuit is constituted by a transistor and therefore, the switching circuit can be integrated to the same semiconductor chip along with the transistors for amplification. Further, according to the invention, the switching circuit is for avoiding the parasitic oscillation, a plurality of switching circuits for switching are dispensed with and therefore, an area of the semiconductor chip can be made smaller than that of the conventional example. Therefore, the high frequency power amplifier can be downsized.

Further, with regard to a position of the switching circuit, according to an investigation by the inventors, it is effective for suppressing parasitic oscillation particularly when the switching circuit is disposed between an input terminal of the output stage transistor and the ground terminal or between a matching circuit between an initial stage and the output stage and the ground terminal.

DETAILED DESCRIPTION OF THE PREFERRED EMBODIMENTS

Figure 1:
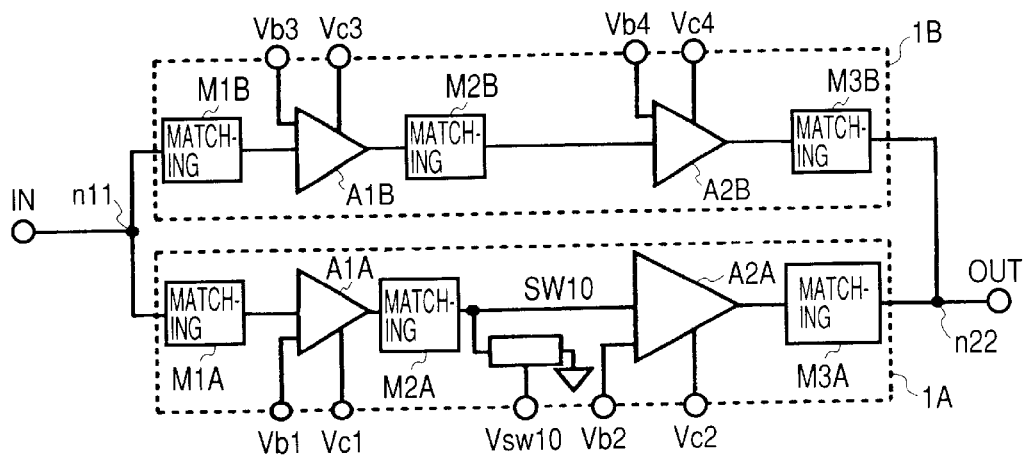
FIG. 1 is a constitution diagram for explaining a first embodiment of a high frequency power amplifier according to the invention.

A further detailed explanation will be given of a high frequency power amplifier, a high frequency power amplifier module and a portable telephone according to the invention in reference to embodiments of the invention by examples shown in the drawings as follows.

EXAMPLES (Embodiment 1)

Figure 3:
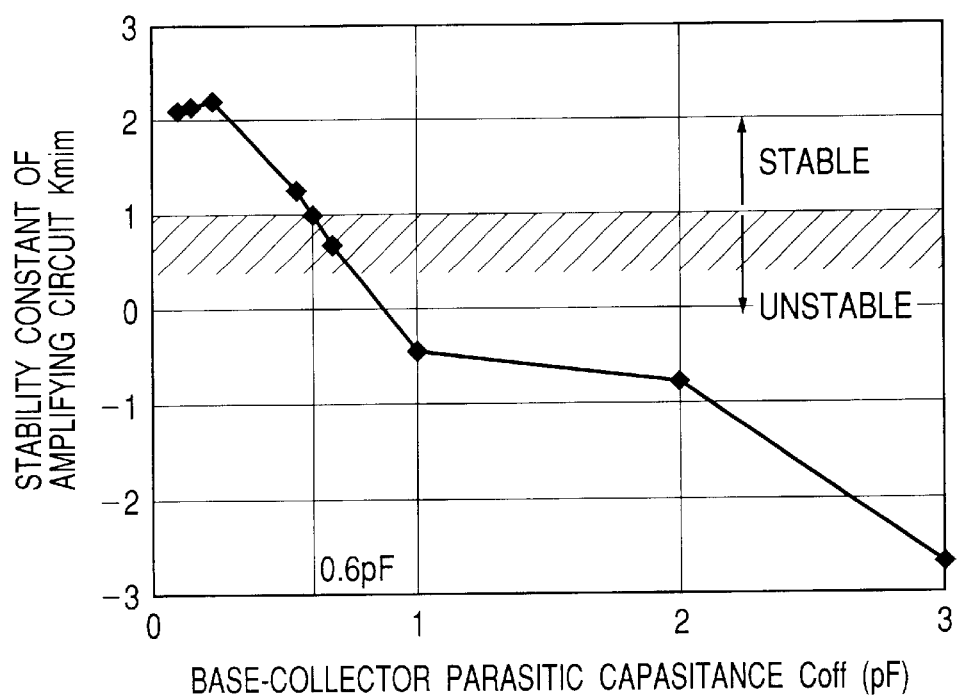
FIG. 3 is a curve diagram for explaining a stability constant of the high frequency power amplifier according to the invention.
Figure 4:
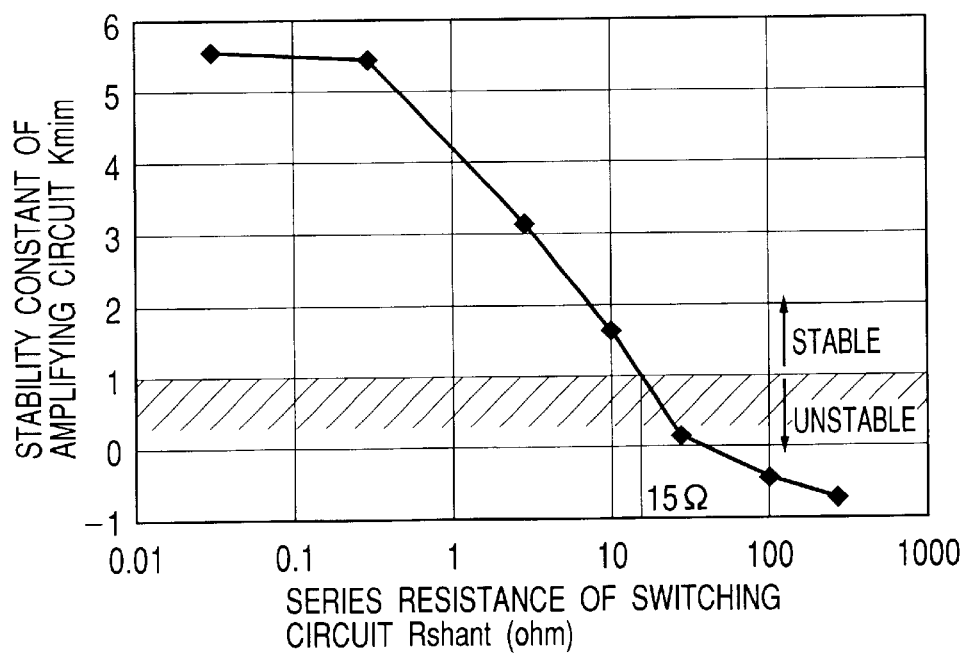
FIG. 4 is other curve diagram for explaining the stability constant of the high frequency power amplifier according to the invention.
Figure 5:
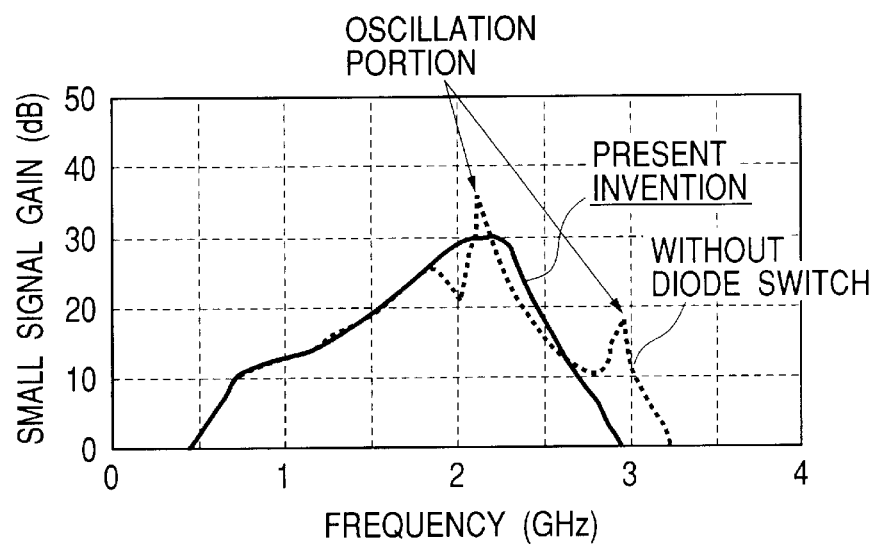
FIG. 5 is a curve diagram for explaining an effect of the high frequency power amplifier according to the invention.
Figure 6:
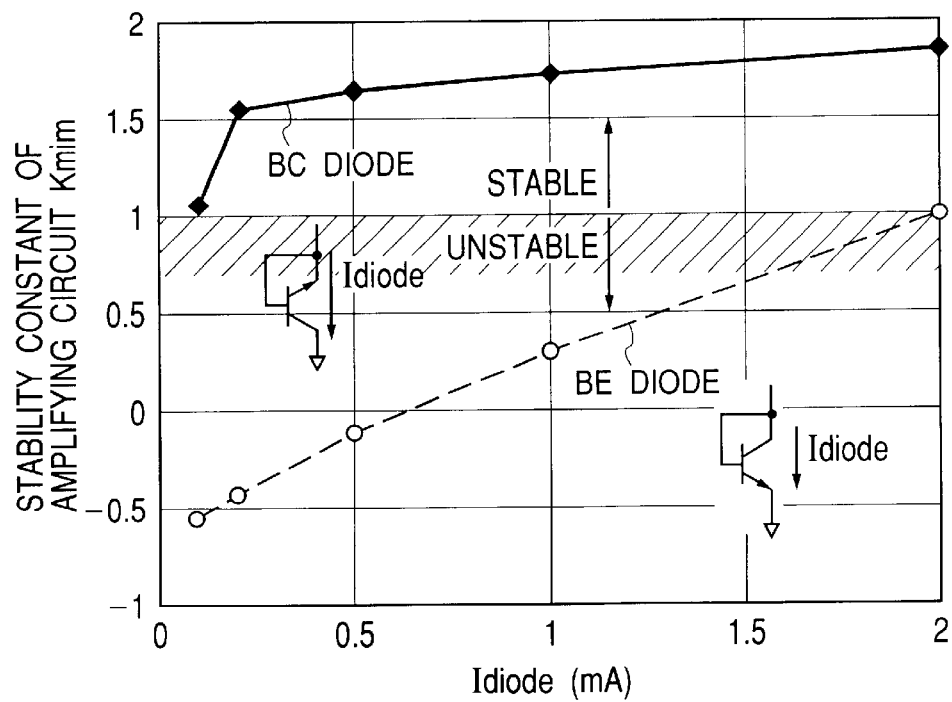
FIG. 6 is still other curve diagram for explaining the stability constant of the high frequency power amplifier according to the invention.

An explanation will be given of a first embodiment of the invention in reference to FIG. 1 through FIG. 6. FIG. 1 is a constitution diagram of a high frequency power amplifier, FIG. 2 is a circuit diagram of an essential portion, FIGS. 3, 4 and 6 are graphs for explaining operation of the invention and FIG. 5 is a graph showing an effect of the invention.

In FIG. 1, notation 1A designates an amplifying circuit on a high output side, notation 1B designates an amplifying circuit on a low output side, input lines of the amplifying circuit 1A and the amplifying circuit 1B are connected to each other at a node n11 and output lines thereof are connected to each other at a node n22. The high output side amplifying circuit 1A is constituted by connecting, in series, an input matching circuit M1A, an initial stage amplifying transistor A1A, an inter-stage matching circuit M2A, an output stage amplifying transistor A2A and an output matching circuit M3A and connecting a switching circuit SW10 constituted by a diode between a signal line connecting the matching circuit M2A and the output stage transistor A2A and a grounding terminal.

Figure 2:
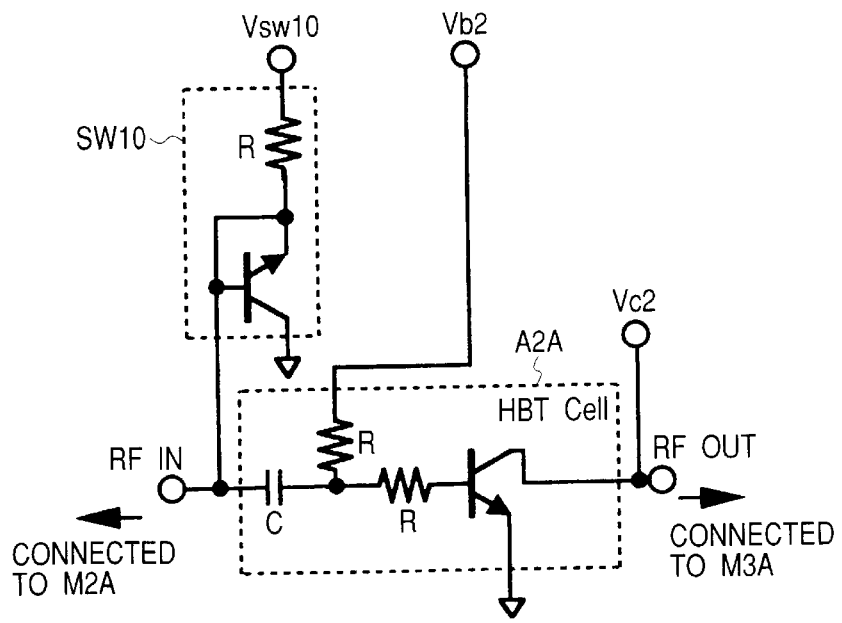
FIG. 2 is a circuit diagram for explaining a switching circuit portion and an output transistor constituting essential portions of the high frequency power amplifier according to the first embodiment.

FIG. 2 shows the diode switch circuit SW10 and a circuit at a periphery thereof. The switching circuit SW10 is connected to an input terminal RFIN of the output stage transistor A2A and operates to short-circuit/open to the ground terminal. A heterojunction bipolar transistor excellent in a high frequency characteristic is used in the output stage transistor A2A and the switching circuit SW10.

Further, the low output side amplifying circuit 1B is constituted by connecting, in series, an input matching circuit M1B, an initial stage amplifying transistor A1B, an inter-stage matching circuit M2B, an output stage amplifying transistor A2B and an output matching circuit M3B.

A size of the output stage transistor A2B is set to be equal to or smaller than ¼ of a size of the output stage transistor A2A. As an example, by constituting a unit by a transistor having an emitter size of 4 μm×30 μm, the output stage transistor A2A is constituted by 36 pieces of unit transistors and the output stage transistor A2B is constituted by 6 pieces of unit transistors.

Next, an explanation will be given of operation of the amplifying circuits 1A and 1B. In operating the amplifying circuit 1A, the switching circuit SW10 is made OFF by bringing a control terminal Vsw10 to a low level (LOW) and in the amplifying circuit 1B, the transistors A1B and A2B are brought into a nonoperational state by bringing a control terminal Vb3 of the initial stage amplifying transistor A1B and a control terminal Vb4 of the output stage amplifying transistor A2B to a low level. A power source terminal Vc3 of the transistor A1B and a power source terminal Vc4 of the transistor A2B may be supplied with power source voltage or may not be supplied therewith conversely.

A signal inputted to the input terminal IN under the above-described state, is amplified to desired output power by the initial stage amplifying transistor A1A (a control terminal Vb1 is brought into a high level (HIGH) and a power source terminal Vc1 thereof is supplied with power source voltage) and the output stage amplifying transistor A2A (a control terminal Vb2 thereof is brought into a high level and a power source terminal Vc2 is supplied with power source voltage) of the amplifying circuit 1A. At this occasion, the switching circuit SW10 is brought into an OFF state, there is constituted impedance sufficiently higher than impedance of the signal line and therefore, power loss is hardly caused.

Further, in operating the amplifying circuit 1B, in the amplifying circuit 1A, the switching circuit SW10 is made ON by bringing the control terminal Vsw10 to a high level and the transistors A1A and A2A are brought into a nonoperational state by bringing the control terminals Vb1 and Vb2 to a low level. The power source terminal Vc1 of the initial stage transistor A1A and the power source terminal Vc2 of the output stage transistor A2A may be supplied with power source voltage or may not be supplied therewith conversely.

A signal inputted to the input terminal IN under the above-described state, is amplified to the desired output voltage by the initial stage amplifying transistor A1B (the control terminal Vb3 is brought into a high level and the power source terminal Vc3 is supplied with power source voltage) and the output stage amplifying transistor A2B (the control terminal Vb4 is brought into a high level and the power source terminal Vc4 is supplied with power source voltage) of the amplifying circuit 1B. Although the diode switching circuit SW10 is brought into an ON state at this occasion, the diode switching circuit SW10 is sufficiently isolated by the transistors A1A and A2A in the nonoperational state disposed on both sides thereof and therefore, power loss is hardly caused.

Successively, parasitic oscillation by a feedback loop is suppressed by the following operation. First, in operating the amplifying circuit 1A, according to an investigation by the inventors, a magnitude of parasitic capacitance of the output stage amplifying transistor A2B of the amplifying circuit 1B which is brought into the nonoperational state, predominantly operates to suppress parasitic oscillation. FIG. 3 shows a result of a simulation of a stability constant K factor (described with a minimum value Kmin in a range of 0 through 10 GHz as a representative value) of a total of the amplifying circuit when a parasitic capacitance Coff between the base and the collector of the transistor A2B in the nonoperational state. The K factor is a parameter on the basis of an inverse number of feedback loop gain and when the K factor is equal to or larger than 1, the circuit is not oscillated but is stable.

As shown by FIG. 3, when the parasitic capacitance Coff of the transistor A2B is equal to or smaller than 0.6 pF, the stability constant Kmin becomes equal to or larger than 1, that is, the amplifying circuit can be stabilized and parasitic oscillation can be suppressed. In order to realize the parasitic capacitance value, the transistor A2B may be constituted by 9 pieces or smaller of unit transistors, in other words, by constituting a size equal to or smaller than ¼ of that of the transistor A2A constituted by 36 pieces of unit transistors, parasitic oscillation can be suppressed.

Next, in operating the amplifying circuit 1B, a magnitude of series resistor of the switching circuit SW10 which is brought into the ON state, predominantly operates to suppress parasitic oscillation. FIG. 4 shows a result of a simulation of the stability constant K factor (described with a minimum value Kmin in a range of 0 through 10 GHz as a representative value) of a total of the amplifying circuit when a series resistance value Rshant of the switching circuit SW10 is changed. As shown by FIG. 4, when the series resistance value of the switching circuit SW10 is equal to or smaller than 15Ω, the stability constant Kmin can be made equal to or larger than 1. That is, the amplifying circuit 1B can be stabilized and parasitic oscillation of the amplifying circuit can be suppressed. A value of the series resistor can be realized by using a single piece of a heterojunction bipolar transistor having an emitter size of 4 μm×30 μm at the diode switching circuit SW10 shown in FIG. 2, as an example, and by a diode between the base and the collector.

FIG. 5 shows an amplifying characteristic of the embodiment when the above-described switching circuit SW10 is provided. Whereas in operating the amplifying circuit 1B, when the switching circuit SW10 is not provided, oscillation phenomena appear at vicinities of 2 GHz and 3 GHz, when the switching circuit SW10 is provided, there is not such an unstable operation and it has been found that parasitic oscillation is sufficiently suppressed. Further, current of 1 mA is made to flow to the diode switching circuit SW10 and the series resistance value at that occasion has been about 10Ω.

FIG. 6 shows a result of a simulation of the stability constant K valuefactor (described with a minimum value Kmin in a range of 0 through 10 GHz as a representative value) of the amplifying circuit 1B when a diode between the base and the collector of a transistor (BC diode) as the diode switching circuit SW10 and when a diode between the base and the emitter (BE diode) is used. Here, in both of the cases, a single piece of the transistor is provided and an emitter size thereof is constituted by 4 μm×30 μm.

Whereas in order to make the stability constant Kmin to be equal to or larger than 1, in the case of the BE diode, current equal to or larger than 2 mA needs to flow, in the case of the BC diode, current in a range of 0.1 mA through 2 mA is sufficient. In view of the result, by using the BC diode at the switching circuit SW10, oscillation of the amplifying circuit 1B can be suppressed by low current and there is achieved an effect of capable of constituting the power amplifier with higher efficiency. Further, the flowing current may be low current and therefore, the diode switching circuit SW10 can be downsized. According to the embodiment, a portion between the transistor A1A to the transistor A2A of the amplifying circuit 1A (including the switching circuit SW10 and the matching circuit M2A) and a portion between the transistor A1B to the transistor A2B of the amplifying circuit 1B (including the matching circuit M2B) can respectively be integrated to a single piece of a semiconductor pellet (semiconductor chip). In this case, since the switching circuit SW10 can be downsized, there is achieved an effect of capable of downsizing the semiconductor pellet and capable of reducing the cost.

Further, although in FIG. 1, a position of the diode switching circuit SW10 is made to constitute an input node of the output stage amplifying transistor A2A, the invention is not limited thereto but the diode switching circuit SW10 may be connected between the signal line frontward from the output stage transistor A2A including a signal node at an inner portion of the matching circuit M2A, that is, any location of the signal line of the amplifying circuit 1A on the high output side and the ground terminalnode. In this case, although the series resistance value of the switching circuit needs to be lower than that in the case shown in FIG. 6, parasitic oscillation can be suppressed.

Further, although the stability constant K factor is made to be equal to or larger than 1, when the higher K factor is adopted in consideration of allowance or the like, the high K factor can be dealt with by arranging a plurality of switching circuits.

Further, in FIG. 1, an active element constituting the high frequency power amplifier may be constituted by a compound semiconductor field effect transistor such as HEMT (High Electron Mobility Transistor) or the like. In this case, operational/nonoperational control of the transistor can be carried out by voltage applied to a gate terminal thereof and therefore, there can be dispensed with a bias circuit which is needed when the bipolar transistor is used and design of the high frequency power amplifier can be simplified.

Further, an active element constituting the high frequency power amplifier may be constituted by a silicon field effect transistor such as Si-MOSFET (Metal Oxide Semiconductor Field Effect Transistor) or the like or a silicon bipolar transistor. In this case, there can be used a process by an inexpensive large diameter silicon wafer and therefore, the high frequency amplifier can be provided at lower cost.

Furthermore, although in FIG. 1, the amplifying circuits 1A and 1B each is constituted by the amplifying circuit of two stages by the initial stage and the output stage, the amplifying circuits 1A and 1B each can be constituted by an amplifying circuit of three stages or more. When the two stages amplifying circuit is constituted, the two stages amplifying circuit is preferably used in an N-CDMA (Narrowband-Code Division Multiple Access) system or a W-CDMA (wideband-Code Division Multiple Access) system which needs 22 through 27 dB as power gain and when the three stages amplifying circuit is constituted, the three stages amplifying circuit is preferably used in a GSM (Global System for Mobile Communication) system or a DCS (Digital Communication System) system which needs larger power gain (32 through 35 dB).

(Embodiment 2)

Figure 7:
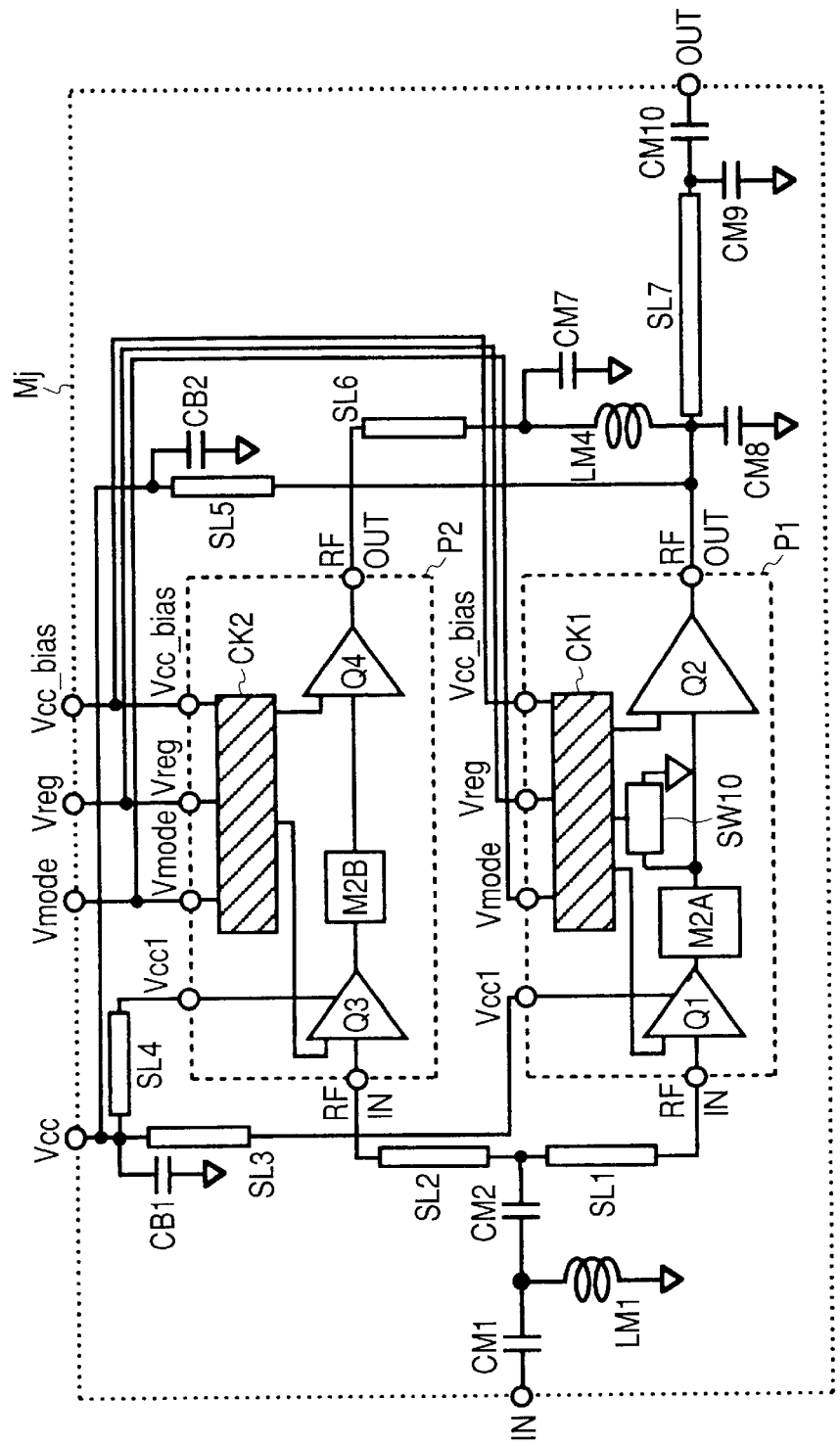
FIG. 7 is a constitution diagram for explaining a second embodiment of a high frequency power amplifier according to the invention.
Figure 13:
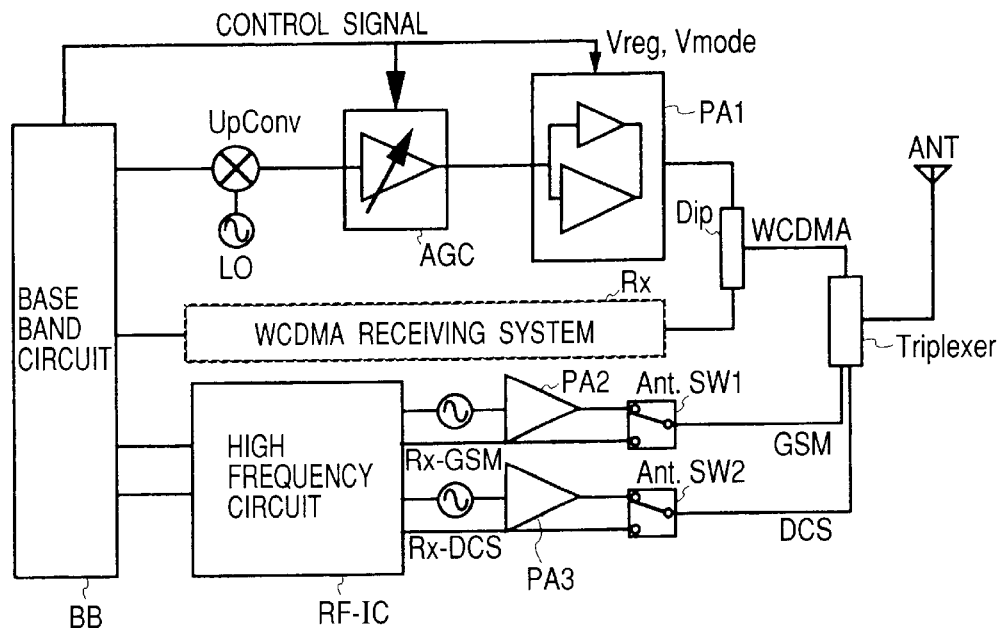
FIG. 13 is a constitution diagram for explaining other portable telephone using the high frequency amplifier according to the invention.
Figure 14:
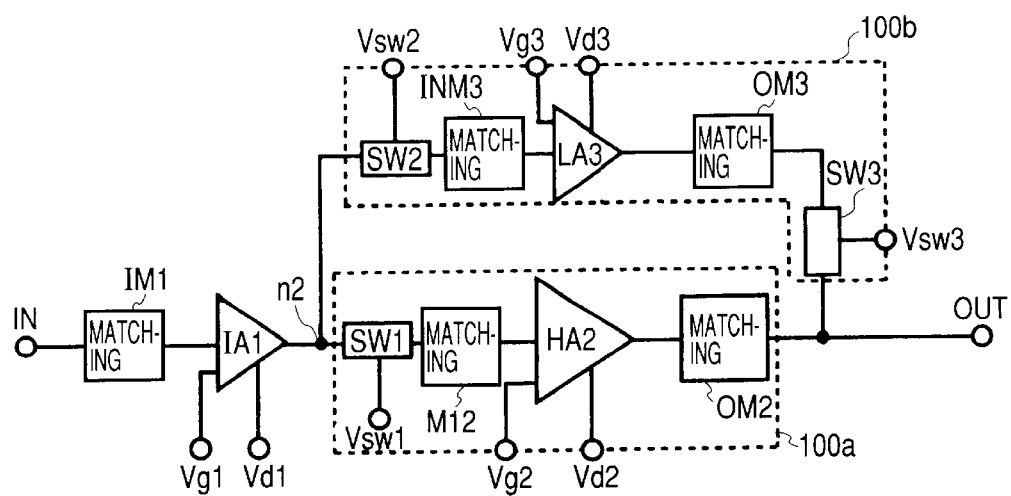
FIG. 14 is a constitution diagram for explaining a high frequency power amplifier according to a conventional technology.

An explanation will be given of a second embodiment in reference to FIG. 7 through FIG. 11. According to Embodiment 2, there is used Embodiment 1, described above, as a basic constitution thereof, which is constituted by a heterojunction bipolar transistor circuit to thereby specifically constitute a high frequency power amplifier module for a W-CDMA portable telephone. FIG. 7 is a total circuit diagram of a high frequency power amplifier module, FIG. 8 and FIG. 9 are detailed circuit diagrams of portions of the high frequency power amplifier in FIG. 7, FIG. 10 is a layout diagram when a circuit shown in FIG. 8 is specifically formed on a semiconductor pellet, FIG. 11 is a table for explaining a method of controlling operation of the high frequency power amplifier and FIGS. 12 and 13 are constitution diagrams of portable telephones using the high frequency amplifier.

In FIG. 7, notations P1 and P2 designate semiconductor pellets comprising gallium arsenide substrates, which are mounted on a module board comprising ceramic and connected to a passive element circuit on the module board. An input matching circuit is constituted by chip capacitors CM1 and CM2, a chip inductor LM1, and microstrip lines SL1 and SL2 formed above the module board. An output matching circuit is constituted by chip capacitors CM7 through CM10, a chip inductor LM4, and microstrip lines SL6 and SL7 formed above the module board.

A power source line from a power source terminal Vcc to transistors are constituted by microstrip lines SL3, SL4, and SL5 and chip capacitors CB1 and CB2 for bypass capacitors. As terminals of the high frequency power amplifier module, there are provided an input node IN, an output node OUT, the power source terminal Vcc, a power source terminal Vcc_bias for a bias circuit, an operational mode switching terminal Vmode and an operational bias control terminal Vreg of an amplifying circuit. A high frequency power amplifier module Mj is formed by the above-described mounting.

Figure 8:
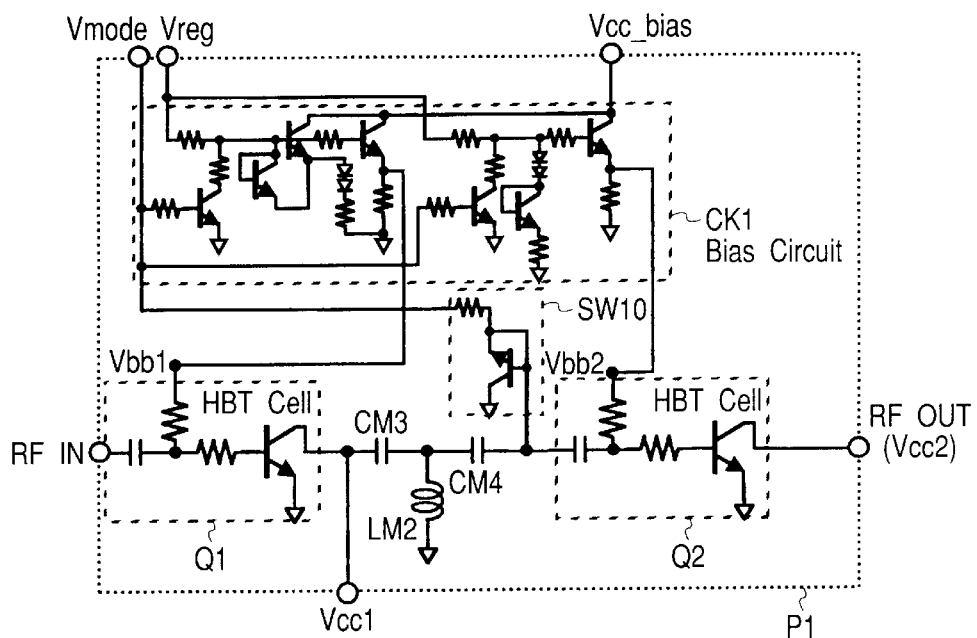
FIG. 8 is a circuit diagram for explaining an essential portion of an amplifying circuit on a high output side according to the second embodiment.
Figure 9:
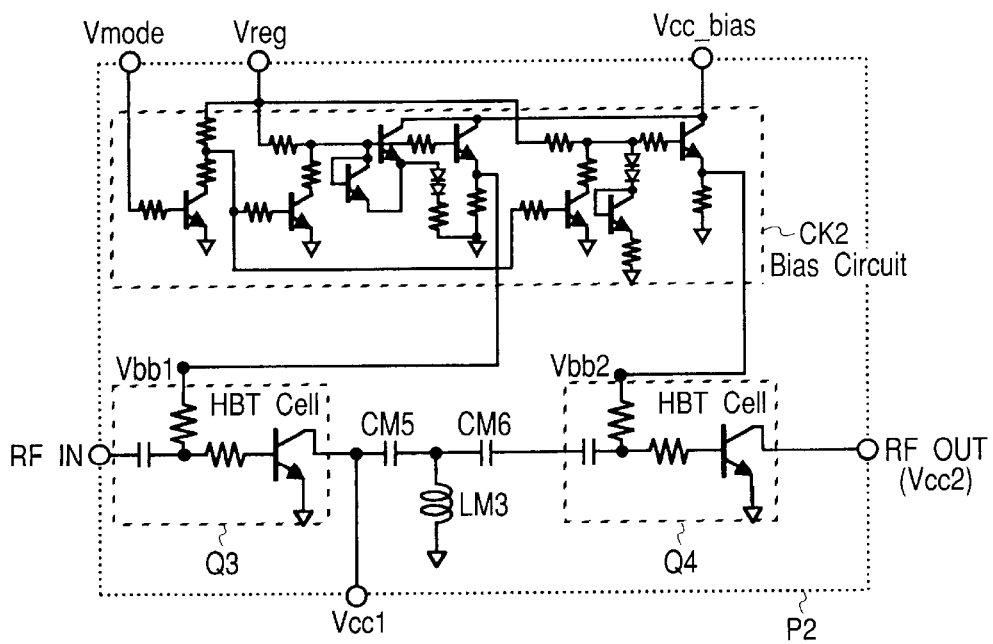
FIG. 9 is a circuit diagram for explaining an essential portion of an amplifying circuit on a low output side according to the second embodiment.
Figure 10:
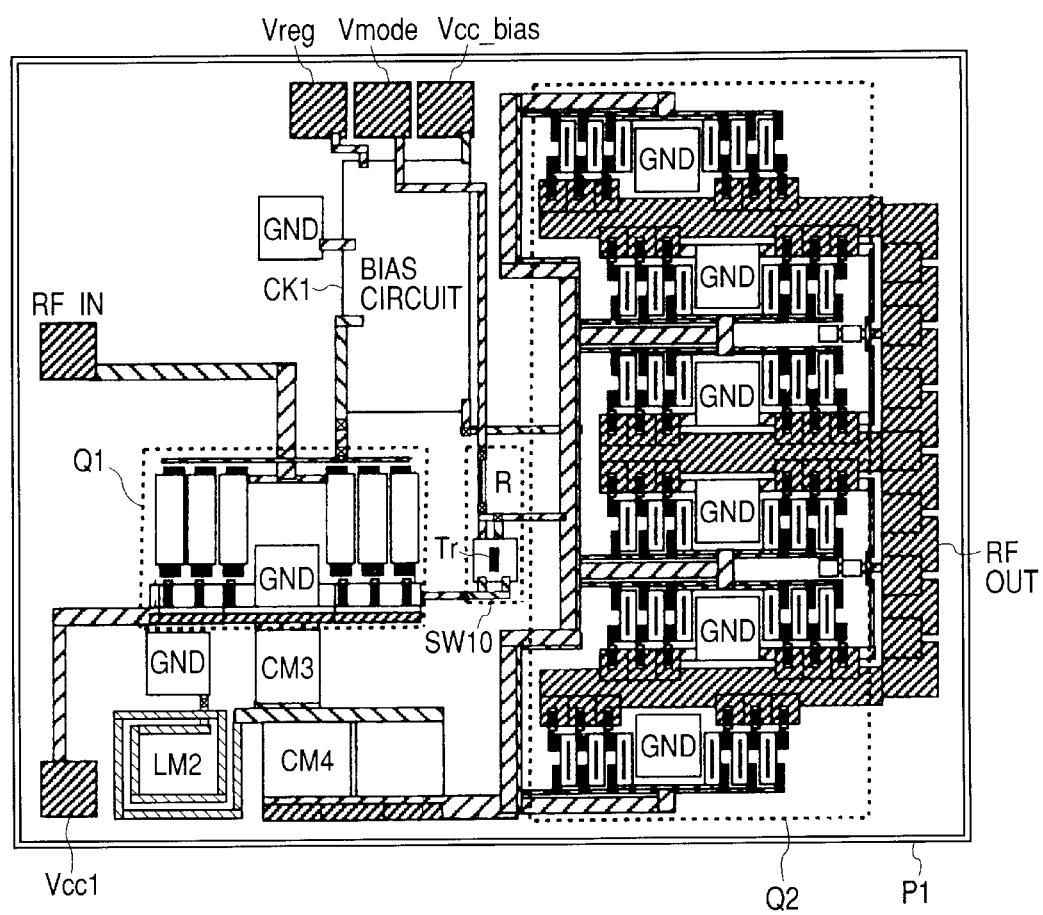
FIG. 10 is a plane view for explaining the essential portion of the amplifying circuit on the high output side according to the second embodiment.
Figures 11, 12:
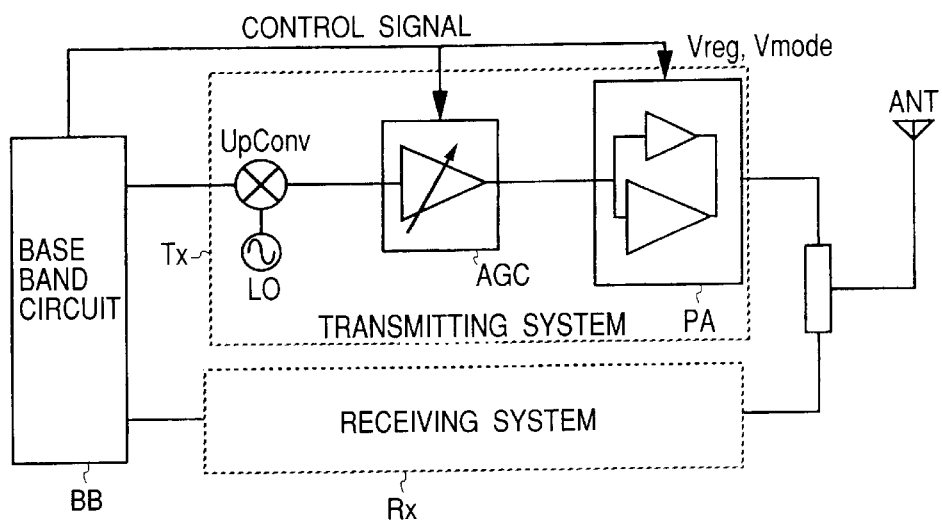
FIG. 11 is a diagram for explaining operation of the high frequency power amplifier according to the second embodiment.
FIG. 12 is a constitution diagram for explaining a portable telephone using the high frequency amplifier according to the invention.

FIG. 8 and FIG. 10 show essential portions of an amplifying circuit on a high output side. In FIG. 8 and FIG. 10, notation Q1 designates an initial stage amplifying transistor and notation Q2 designates an output stage amplifying transistor. By respectively constituting an emitter size of a unit transistor by 4 $\mu$m×30 $\mu$m, the input amplifying transistor Q1 is constituted by 6 pieces of the unit transistors and the output stage amplifying transistor Q2 is constituted by 36 pieces of the unit transistors. The transistors Q1 and Q2 include capacitors and resistors for separating direct current and an RF signal and series resistors for ballast other than the unit transistors. Notation SW10 designates a switching circuit and a diode between the base and the collector of a transistor is used therefor. The transistor for diode is a single piece of a transistor having an emitter size of 4 $\mu$m×30 $\mu$m. An inter-stage matching circuit M2A is constituted by MIM (metal-insulator-metal) capacitance elements CM3 and CM4 and a spiral inductor element LM2. Notation CK1 designates a bias circuit for supplying base bias current to the transistors Q1 and Q2. All of the elements shown in FIG. 8 are formed on the same semiconductor pellet P1.

FIG. 9 shows essential portions of an amplifying circuit on a low output side. In FIG. 9, notation Q3 designates an initial stage amplifying transistor and notation Q4 designates an output stage amplifying transistor. By constituting an emitter size of a unit transistor by 4 $\mu$m×30 $\mu$m, both of the input amplifying transistor Q3 and the output stage amplifying transistor Q4 are constituted by 6 pieces of unit transistors. The transistors Q3 and Q4 respectively include capacitors and resistors for separating direct current and a high frequency signal and series resistors for ballast other than the unit transistors. An inter-stage matching circuit M2B is constituted by MIM (metal-insulator-metal) capacitance elements CM5 and CM6 and a spiral inductor element LM3. Notation CK2 designates a bias circuit for supplying base bias current to the transistors Q3 and Q4. All of the elements shown in FIG. 9 are formed on the same semiconductor pellet P2.

Next, an explanation will be given of a method of controlling operation of the high frequency power amplifier module with reference to FIG. 11. First, at high output time, the operational mode switching terminal Vmode is applied with voltage at a low level (low level) and the operational bias control terminal Vreg is applied with desired voltage constituting a high level (high level). By the control, the amplifying transistors Q1 and Q2 on the high output side are brought into an operational state and the amplifying transistors Q3 and Q4 on the low output side are brought into a nonoperational state and the diode switching circuit SW10 is brought into an OFF state. Thereby, the amplifying circuit on the high output side is operated.

At low output time, the operational mode switching terminal Vmode is applied with voltage at a high level and the operational bias control terminal Vreg is applied with desired voltage constituting a high level. By the control, the amplifying transistors Q3 and Q4 on the low output side are brought into the operational state, the diode switching circuit SW10 is brought into an ON state and amplifying transistors Q1 and Q2 on the high output side are brought into the nonoperational state. Thereby, the amplifying circuit on the low output side is operated. At this occasion, oscillation by a feedback loop via the amplifying circuit on the high output side which is brought into the nonoperational state, can be prevented by the switching circuit SW10 which is brought into the ON state.

At standby time of the power amplifier, voltage at the low level is applied to both of the operational mode switching terminal Vmode and the operational bias control terminal Vreg. By the control, all of the amplifying transistors Q1 through Q4 are brought into the nonoperational state and the diode switching circuit SW10 is brought into the OFF state. Further, there is brought about a state in which also terminal current of the bias circuits CK1 and CK2 does not flow. Thereby, consumption current at standby time can be minimized.

Further, it is prohibited to apply voltage at the high level to the operational mode switching terminal Vmode and voltage at the low level to the operational bias control terminal Vreg. Thereby, there is prohibited a state in which only the diode switching circuit SW10 is made ON and wasteful current consumption is avoided.

Next, an explanation will be given of a constitution of a portable telephone using the high frequency power amplifier module according to Embodiment 2 in reference to FIG. 12. A portable telephone shown in FIG. 12 is used in the W-CDMA system. The portable telephone is constituted by a base band circuit BB, a receiving system circuit Rx, a transmitting system circuit Tx and an antenna system ANT. Further, the transmitting system circuit Tx is constituted by a transmission local oscillator LO, an up converter UpConv, an automatic gain control amplifier AGC and a power amplifier PA. Switching operation is carried out by applying the high frequency power amplifier module of Embodiment 2 to the power amplifier PA and giving control signals from the base band circuit BB to the control terminal Vreg and the control terminal Vmode. Further, with regard to the control signals of the control terminal Vreg and the control terminal Vmode, it is preferable to form the control signals in the form of reproducing/determining a request value of output power from the base station by the base band circuit BB and operating the automatic gain control amplifier AGC and the power amplifier PA in cooperation with each other.

Next, an explanation will be given of a constitution of other portable telephone using the high frequency power amplifier module according to Embodiment 2 in reference to FIG. 13. The portable telephone shown in FIG. 13 is a portable telephone for a composite system capable of being used in three systems of GSM, DCS, and W-CDMA. The portable telephone is constituted by a base band circuit BB, a receiving system circuit Rx, a high frequency circuit RF-IC, a transmitting system circuit and an antenna system ANT.

Among them, the transmitting system circuit of the W-CDMA system is constituted by a transmission local oscillator L0, an up converter UpConv, an automatic gain control amplifier AGC and a power amplifier PA1 as shown by FIG. 13. Switching operation is carried out by applying the high frequency power amplifier module according to Embodiment 2 to the power amplifier PA1 and giving control signals from the base band circuit BB to the control terminal Vreg and the control terminal Vmode. Further, with regard to the control signals to the control terminal Vreg and the control terminal Vmode, it is preferable to form the control signals in the form of reproducing/determining a request value of output power from the base station by the base band circuit BB and operating the automatic gain control amplifier AGC and the power amplifier PA in cooperation with each other. Further, there are used respectively separate power amplifiers PA2 and PA3 for a transmitting system circuit of GSM system and a transmitting system circuit of DCS system. Output powers amplified by the power amplifiers are supplied to the antenna ANT by a triplexer Triplexer constituting a three frequencies wave synthesizer and divider via antenna switches Ant.SW1 and Ant.SW2 and a diplexer Dip.

According to the above-described portable telephone, by using the high frequency power amplifier according to the invention, both of high power and low power can be outputted with high efficiencies and low power consumption and small-sized formation can be realized.

According to the invention, by providing the switching circuit for preventing oscillation, switching circuits inserted in series in a circuit can be dispensed with and therefore, both of high power and low power can be outputted with high efficiencies and the small-sized high frequency power amplifier at low cost and a module thereof can be realized. By adopting the high frequency power amplifier module, the small-sized portable telephone with high efficiency can be realized.

What is claimed is:

1. A high frequency power amplifier comprising:
   a first amplifying circuit having a first output stage including a first transistor;
   a second amplifying circuit having a second output stage including a second transistor having a size equal to or smaller than ¼ of a size of the first transistor;
   a switching circuit connected between a signal line at the first amplifying circuit frontward from the first output stage and a ground terminal;
   an input terminal constituted by an input line of the first amplifying circuit and an input line of the second amplifying circuit to each other; and
   an output terminal constituted by connecting an output line of the first amplifying circuit and an output line of the second amplifying circuit to each other,
   wherein the first amplifying circuit outputs a high frequency signal at a first output level to the output terminal when the switching circuit is brought into an off state and the second amplifying circuit is brought into a nonoperational state, and
   wherein the second amplifying circuit outputs a high frequency signal at a second output level lower than the first output level when the switching circuit is brought into an on state and the first amplifying circuit is brought into the nonoperational state.

2. A high frequency power amplifier comprising:
an input terminal inputted with a high frequency signal to be amplified;
an output terminal for outputting an amplified high frequency signal;
a first amplifying circuit including a first transistor for amplifying the signal inputted to the input terminal, a second transistor for amplifying an output signal of the first transistor, a first matching circuit connected between an output of the first transistor and an input of the second transistor, a second matching circuit connected between an output of the second transistor and the output terminal and at least one piece of a switching circuit connected between a signal line constituted by the first transistor and the second transistor and a ground terminal; and
a second amplifying circuit including a third transistor for amplifying the high frequency signal inputted to the input terminal, a fourth transistor for amplifying an output signal of the third transistor, a third matching circuit connected between an output of the third transistor and an input of the fourth transistor and a fourth matching circuit connected between an output of the fourth transistor and the output terminal,
wherein the fourth transistor is provided with a size equal to or smaller than ¼ of a size of the second transistor,
wherein the first and the second transistors output a high frequency signal at a first power level when the third and the fourth transistors are brought into a nonoperational state and the at least one piece of the switching circuit is made off, and
wherein the third and the fourth transistors output a high frequency signal at a second power level smaller than the first output level when the first and the second transistors are brought into the nonoperational state and the at least one piece of the switching circuit is made on.

3. A high frequency power amplifier comprising:
an input terminal inputted with a high frequency signal to be amplified;
an output terminal for outputting an amplified high frequency signal;
a first amplifying circuit including a first transistor for amplifying the signal inputted to the input terminal, a second transistor for amplifying an output signal of the first transistor, a first matching circuit connected between an output of the first transistor and an input of the second transistor, a second matching circuit connected between an output of the second transistor and the output terminal and at least one piece of a switching circuit connected between an input terminal of the second transistor or a signal node in the first matching circuit and a ground terminal; and
a second amplifying circuit including a third transistor for amplifying the high frequency signal inputted to the input terminal, a fourth transistor for amplifying an output signal of the third transistor, a third matching circuit connected between an output of the third transistor and an input of the fourth transistor and a fourth matching circuit connected between an output of the fourth transistor and the output terminal,
wherein the fourth transistor is provided with a size equal to or smaller than ¼ of a size of the second transistor,
wherein the first and the second transistors output a high frequency signal at a first power level when the third and the fourth transistors are brought into a nonoperational state and the at least one piece of the switching circuit is made off, and
wherein the third and the fourth transistors output a high frequency signal at a second power level smaller than the first output level when the first and the second transistors are brought into the nonoperational state and the at least one piece of the switching circuit is made on.

4. The high frequency power amplifier according to claim 2, wherein the first through the fourth transistors are heterojunction bipolar transistors.

5. The high frequency power amplifier according to claim 3, wherein the first through the fourth transistors are heterojunction bipolar transistors.

6. The high frequency power amplifier according to claim 2, wherein the first through the fourth transistors are field effect transistors.

7. The high frequency power amplifier according to claim 3, wherein the first through the fourth transistors are field effect transistors.

8. The high frequency power amplifier according to claim 2, wherein the first and the second transistors and at least the one piece of the switching circuit are constituted by heterojunction bipolar transistors on a same semiconductor chip.

9. The high frequency power amplifier according to claim 3, wherein the first and the second transistors and at least the one piece of the switching circuit are constituted by heterojunction bipolar transistors on a same semiconductor chip.

10. A high frequency power amplifier according to claim 1, formed as a high frequency power amplifier module on an insulating board.

11. A high frequency power amplifier according to claim 2, formed as a, high frequency power amplifier module on an insulating board.

12. A high frequency power amplifier according to claim 3, formed as a high frequency power amplifier module on an insulating board.

13. A high frequency power amplifier module according to claim 10 formed in a portable telephone.

14. A high frequency power amplifier module according to claim 11 formed in a portable telephone.

15. A high frequency power amplifier module according to claim 12 formed in a portable telephone.

16. A high frequency power amplifier module according to claim 10 for a CDMA (code division multiple access) system formed in a portable telephone for a composite system.

17. A high frequency power amplifier module according to claim 11 for a CDMA (code division multiple access) system formed in a portable telephone for a composite system.

18. A high frequency power amplifier module according to claim 12 for a CDMA (code division multiple access) system formed in a portable telephone for a composite system.

19. The high frequency power amplifier according to claim 1, further comprising:
an operational mode switching terminal and an operational bias control terminal for controlling operation of the first through the fourth transistors and at least one piece of the switching circuit,
wherein when the high frequency signal at the first power level is outputted, by applying a voltage at a low level to the operational mode switching terminal and applying a desired voltage constituting a high level to the operational bias control terminal, the first and the second transistors are brought into an operational state, the third and the fourth transistors are brought into a nonoperational state and the at least one piece of the switching circuit is made off, wherein when the high frequency level at the second power level is outputted, by applying a voltage at a high level to the operational mode switching terminal and applying a desired voltage constituting a high level to the operational bias control terminal, the third and the fourth transistors are brought into an operational state, the at least one piece of the switching circuit is made on and the first and the second transistors are brought into the nonoperational state, and wherein at standby time, by applying the voltage at the low level to both of the operational mode switching terminal and the operational bias control terminal, the first through the fourth transistors are brought into the nonoperational state and the at least one piece of the switching circuit is made off.

20. The high frequency power amplifier according to claim 2, further comprising:

an operational mode switching terminal and an operational bias control terminal for controlling operation of the first through the fourth transistors and at least one piece of the switching circuit, wherein when the high frequency signal at the first power level is outputted, by applying a voltage at a low level to the operational mode switching terminal and applying a desired voltage constituting a high level to the operational bias control terminal, the first and the second transistors are brought into an operational state, the third and the fourth transistors are brought into a nonoperational state and the at least one piece of the switching circuit is made off, wherein when the high frequency level at the second power level is outputted, by applying a voltage at a high level to the operational mode switching terminal and applying a desired voltage constituting a high level to the operational bias control terminal, the third and the fourth transistors are brought into an operational state, the at least one piece of the switching circuit is made on and the first and the second transistors are brought into the nonoperational state, and wherein at standby time, by applying the voltage at the low level to both of the operational mode switching terminal and the operational bias control terminal, the first through the fourth transistors are brought into the nonoperational state and the at least one piece of the switching circuit is made off.

* * * * *